United States Patent [19]

Siddoway

[11] Patent Number: 5,784,688
[45] Date of Patent: Jul. 21, 1998

[54] PORTABLE RADIO COMMUNICATION DEVICE WITH A ROTARY CONTROL KNOB ASSEMBLY

[75] Inventor: Craig F. Siddoway, Davie, Fla.

[73] Assignee: Motorola, Inc., Schaumburg, Ill.

[21] Appl. No.: 610,297

[22] Filed: Mar. 4, 1996

[51] Int. Cl.⁶ .................................................. H04B 1/38
[52] U.S. Cl. .................................... 455/90; 455/575
[58] Field of Search .............................. 455/575, 90, 128, 455/347, 351, 450, 170.1; 379/433, 434, 368; 361/600, 679, 814, 837; 200/336, 43.11, 43.13; 439/135; D14/137

[56] References Cited

U.S. PATENT DOCUMENTS

| D. 243,861 | 3/1977 | Akazawa | D14/3 |
|---|---|---|---|
| D. 280,507 | 9/1985 | Claxton et al. | D14/68 |
| D. 309,136 | 7/1990 | Siddoway | D14/137 |
| D. 352,706 | 11/1994 | Hong | D14/137 |
| D. 356,790 | 3/1995 | Davison, Jr. et al. | D14/137 |
| D. 382,869 | 8/1997 | Siddoway et al. | D14/137 |
| 3,346,812 | 10/1967 | McKenna et al. | 325/16 |
| 4,929,806 | 5/1990 | Furuhashi et al. | 200/61.54 |
| 5,159,712 | 10/1992 | Schneider et al. | 455/344 |
| 5,280,651 | 1/1994 | Lenihan et al. | 455/351 |
| 5,555,449 | 9/1996 | Kim | 455/89 |

*Primary Examiner*—Reinhard J. Eisenzopf
*Assistant Examiner*—Darnell R. Armstrong
*Attorney, Agent, or Firm*—Andrew S. Fuller

[57] ABSTRACT

A portable radio (100) has a control assembly (110) with controls to operate the radio. The portable radio (100) includes a radio housing (101) with a control interface (103) oriented along a particular plane. Two rotary control knobs (122, 124) are attached at the control interface (103), and have respective base portions (123, 125) separated by a first spacing, and respective top portions (132, 134) separated by a second spacing. The second rotary control knob (122) is angled to cause the second spacing to be substantially more than first spacing.

8 Claims, 3 Drawing Sheets

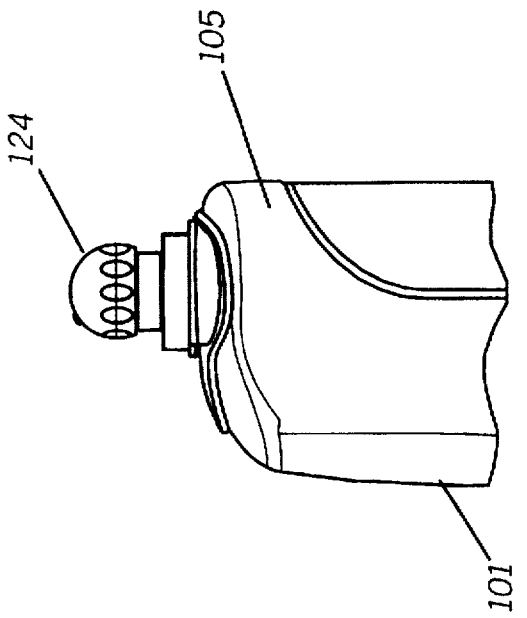
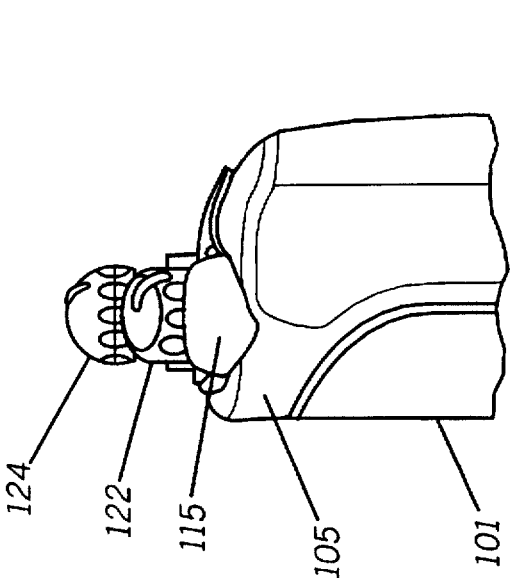

5,784,688

1

PORTABLE RADIO COMMUNICATION DEVICE WITH A ROTARY CONTROL KNOB ASSEMBLY

TECHNICAL FIELD

This invention relates in general to portable radio devices, and in particular, to a control assembly for a portable radio communication device.

BACKGROUND

A portable two-way radio communication device usually has external actuators or controls for operating the device. Controls typically include a channel selector switch, a volume control switch, and an on/off switch, which are often clustered in a common location for easy access. Generally, the controls are located at the top of the device to provide easy access when the device is attached to a belt, or situated on a support in an upright position.

Many portable two-way radios have rotary control knobs for certain functions. Rotary control knobs are generally preferred because of the provision such benefits as ease of operation, tactile feedback, and the like. Large rotary control knobs are particularly useful when a radio operator is wearing gloves. The advent of miniaturization for electronic products has resulted in increasingly smaller portable radio products. With a smaller radio, there is less space to house the standard array of radio controls. Although these controls must fit in a smaller area, they must still support ease of operation.

There are various prior art approaches with respect to the arrangement of controls on smaller portable radios. In one approach, the control knobs are simply made smaller. In another approach, push buttons and other miniaturized controls are used to replace the traditional rotary control knob. These approaches have proven inadequate for many situations. One example is the difficulty in operating the smaller controls, particularly when the radio is situated on a belt, or is being operated by one wearing a glove.

In another prior art approach, different size rotary control knobs are used. For example, one control knob may be made taller than an adjacent control knob. With this approach, the taller knob is usually easier is to operate. However, it may be difficult to operate the smaller knob without interference from an adjacent knob.

It is desirable to provide an arrangement of controls for operating portable radios as these devices are miniaturized. Such controls should still facilitate ease of operation.

BRIEF DESCRIPTION OF THE DRAWINGS

FIG. 5 is a left side view thereof;

FIG. 6 is a right side view thereof.

DETAILED DESCRIPTION OF THE PREFERRED EMBODIMENT

Generally, the present invention provides for a portable radio with a control assembly having an angled rotary control knob. The control assembly includes a radio housing portion with a control interface oriented along a particular plane. Two rotary control knobs are adjacently attached at

2 the control interface. Each rotary control knob has a base portion and top portion. At least one of the control knobs is angled to cause the spacing between the respective top portions to be substantially more than the spacing between the respective base portions. In one embodiment, a shroud surrounds at least a portion of the angled control knob to provide protection from damage due to accidental drop or the like.

Figure 2:
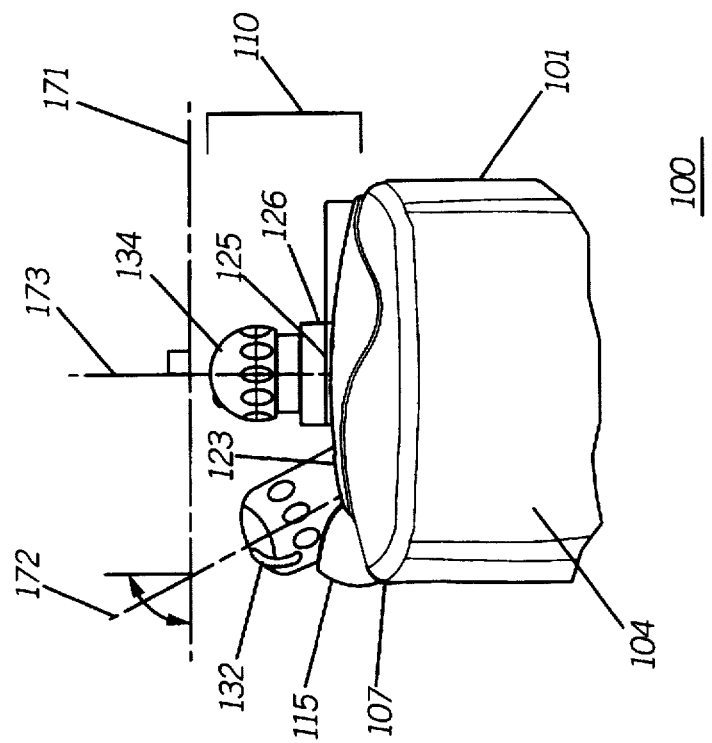
FIG. 2 is a front view thereof.
Figure 1:
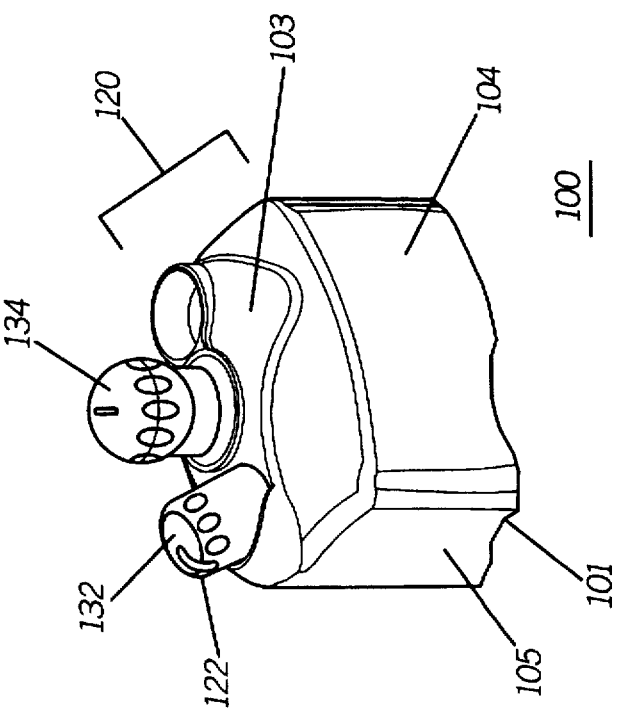
FIG. 1 is an isometric view of a radio having a control assembly, in accordance with the present invention.
Figure 4:
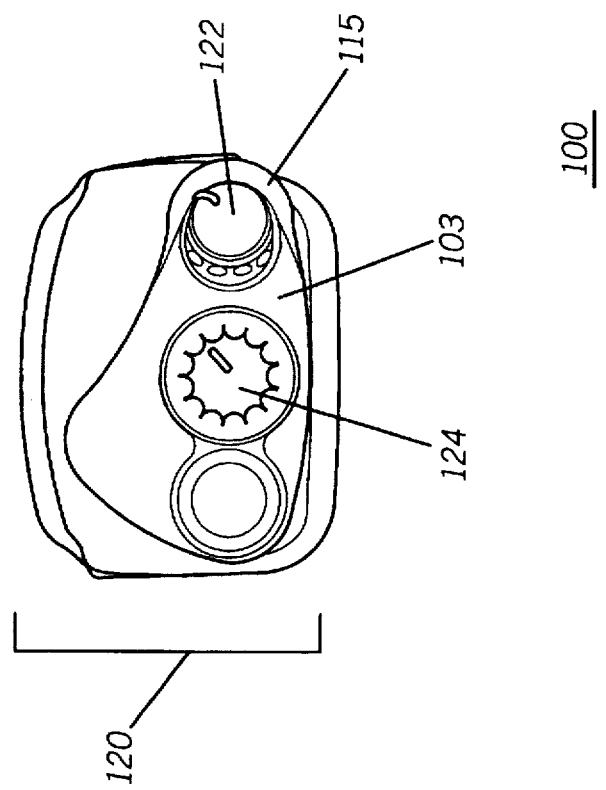
FIG. 4 is a top view thereof.
Figure 3:
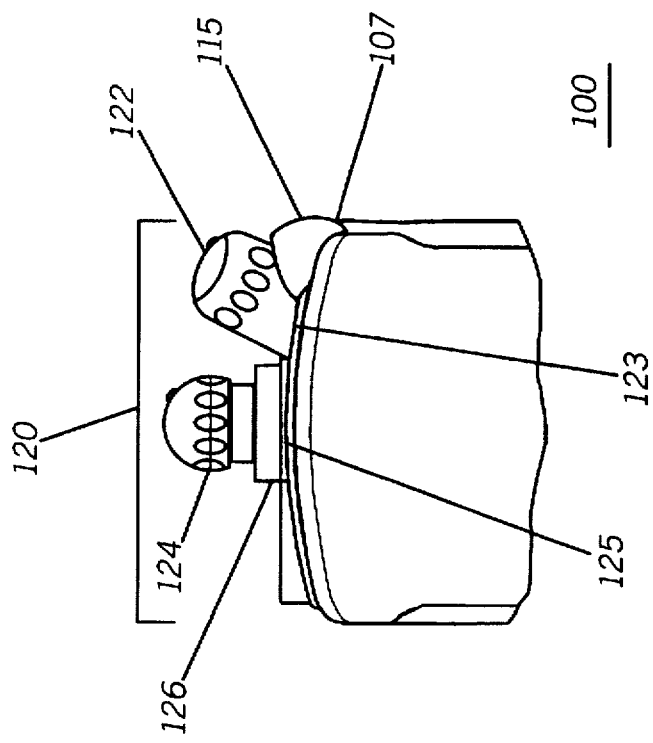
FIG. 3 is a rear view thereof.

FIG. 1 is a fragmentary isometric view of a portable radio 100 having a control assembly, in accordance with the present invention. The portable radio 100 is a two-way communication device having circuitry for communicating using radio frequency signal. FIG. 2 is a fragmentary front view thereof, FIG. 3 is fragmentary a rear view thereof, FIG. 4 is a top view thereof, FIG. 5 is a fragmentary left side view thereof, and FIG. 6 a fragmentary right side view thereof. Referring to FIGS. 1–6, the portable radio 100 includes a radio housing 101 with a top surface 103, a front surface 104, and side surfaces 105. A control assembly or head 110 is situated toward a top portion of the radio 100, and includes a cluster of controls (control cluster) 120 that supports operational control of the radio 100. The control cluster 120 is disposed on the top surface 103 of the radio 100, and includes control knobs 122, 124, 126. Thus, the top surface 103 presents a control interface for the radio 100.

According to the present invention, the control cluster 120 has control knobs 122, 124, having a rotary mode of operation, attached at the control interface 103. At least one rotary control knob 122 is disposed or oriented at an angle with respect to an adjacent rotary control knob 124. The angled rotary control knob 122 is so oriented to substantially increase the spacing between top portions 132, 134 of the angled rotary control knob and an adjacent rotary control knob, respectively. A significant benefit of this configuration is that large easily graspable rotary control knobs can be commonly located in a restricted space environment, while providing sufficient space between the top portions of the rotary control knob to facilitate operation of a rotary control knob without substantial interference from an adjacent knob.

In the preferred embodiment the control interface is oriented along a plane 171 extending across the top surface 103 of the portable radio 100. The control interface 103 has attached thereto a first control knob 124 that functions as a channel selector switch actuator, and a second control knob 122 that functions as a volume control and on/off control combination switch actuator. The first and second rotary control knobs 122, 124 have respective base portions 123, 125 attached at the control interface, and free end top portions 132, 134. The first control knob 124 is substantially perpendicular to the plane 171. Accordingly, the control knob 124 projects from the top surface and is oriented perpendicular to the top surface. The second control knob 122 projects from the top surface and is angled at an acute angle with respect to the first control knob and with respect to the plane 171. The respective base portions 123, 125 are separated by a spacing measured with respect to a central rotational axis 172, 173 extending through each rotary control knob. The angling of the control knob 122 causes the spacing of the top portions 132, 134, measured with respect to the axes 172, 173, to be substantially more than the spacing at the base portions.

The control assembly 110 of the preferred embodiment has a portion 107 that forms the edge of the control interface or cluster. The angled control knob 122 projects along the edge portion 107 and therefore has increase susceptibility to damage from an accidental drop or the like. Accordingly, the radio housing includes a shroud 115 projecting from the control interface 103 that envelops a portion of the angled control knob 122. Preferably, the shroud is formed by a hollow bulge that protrudes along the edge portion 107 and encloses a substantial part of the base portion 123 of the angled control knob 122. The shroud 115 tapers to expose all of the top portion of the angled control knob. The shroud provides protection for the angled control knob from damage as a result of an accidental drop or the like. The design of the shroud 115 provides this protection without consuming valuable space on the control interface, and allows the base portion 123 of the angled control knob 122 to be located closer to adjacent control knobs.

The present invention provides for significant benefits over the prior art. The novel angling arrangement allows large rotary control knobs to be provided adjacent to each other in a restrictive space environment, while allowing sufficient space between the top portions of the knobs, thus providing for substantial improvement in ease of operation. The shroud partially enveloping the control knob provides protection from accidental drop without a significant hit on space consumption at the control interface.

What is claimed is:

1. A portable radio having a control assembly, comprising:
   a radio housing having control interface oriented along a particular plane; and
   first and second rotary control knobs attached at the control interface, and having base portions separated by a first spacing, and having top portions separated by a second spacing;
   wherein the second rotary control knob is angled to cause the second spacing to be substantially more than first spacing, and the first rotary control knob has a rotational axis substantially perpendicular to the control interface, and the second rotary control knob has a rotational axis at an acute angle with respect to the control interface.

2. The portable radio of claim 1, wherein the control interface has an edge portion, and the second rotary control knob projects along the edge portion, and wherein the radio housing includes a hollow shroud projecting from the control interface and individually enveloping a portion of the second rotary control knob, wherein the second rotary control knob has a base portion and a top portion and is oriented in an angled manner within the shroud, the shroud being tapered from the base portion toward the top portion of the second rotary control knob.

3. The portable radio of claim 1, wherein the first rotary control knob comprises a channel selector switch, and the second rotary control knob comprises a volume control and on/off control combination switch.

4. A portable two-way communication device, comprising:
   a radio housing having a top surface, and front and side surfaces; and
   a control cluster disposed on the top surface, the control cluster including first and second rotary control knobs each having a base portion and a top portion, the first and second rotary control knobs being spaced apart and being oriented such that the base portions are substantially closer to each other than the top portions are to each other;
   wherein the control cluster has controls distributed along a plane extending across the top surface in a substantially planar manner, the first rotary control knob has a rotational axis substantially perpendicular to the top surface, and the second rotary control knob has a rotational axis angled at an acute angle from the first rotary control knob and from the top surface.

5. The communication device of claim 4, wherein the control cluster has an edge portion, and the second rotary control knob projects along the edge portion, and wherein the radio housing includes a shroud enveloping a portion of the second rotary control knob, the shroud being tapered from the base portion toward the top portion of the second rotary control knob.

6. The communication device of claim 5, wherein the shroud comprises a hollow bulge protruding along the edge portion of the control cluster, the shroud enclosing a substantial part of the base portion and tapering to expose all of the top portion of the second rotary control knob.

7. The communication device of claim 4, wherein the first rotary control knob comprises a channel selector switch, and the second rotary control knob comprises a volume control and on/off control combination switch.

8. A portable radio for two-way communications, comprising:
   a radio housing having a top surface, front surface, and side surfaces;
   a control cluster disposed along the top surface, the control cluster having a plurality of control actuators, the control cluster having an edge portion, the control cluster comprising:
   a first control knob projecting from the top surface and, the first control knob having a base portion and a top portion, the first control knob having a rotary mode of operation about a rotational axis substantially perpendicular to the top surface;
   a second control knob projecting from the top surface and having a rotary mode of operation about a rotational axis at an acute angle to the top surface, the second control knob having a base portion at a first spacing from the base portion of the first control knob, and being angled to have a top portion at a second spacing from the top portion of the second control knob, the second spacing being substantially greater than the first spacing; and a shroud projecting along the edge portion of the control cluster and individually enveloping a portion of the second control knob the shroud being tapered from the base portion toward the top portion of the second control knob.

* * * * *